(12) United States Patent
Schmidt et al.

(10) Patent No.: US 9,893,215 B2
(45) Date of Patent: Feb. 13, 2018

(54) METHOD FOR MANUFACTURING A SOLAR CELL WITH A SURFACE-PASSIVATING DIELECTRIC DOUBLE LAYER, AND CORRESPONDING SOLAR CELL

(75) Inventors: Jan Schmidt, Hameln (DE); Bram Hoex, Singapore (SG)

(73) Assignees: HANWHA Q CELLS CO., LTD, Grand Cayman (KY); SOLARWORLD INDUSTRIES GMBH, Bonn (DE)

( * ) Notice: Subject to any disclaimer, the term of this patent is extended or adjusted under 35 U.S.C. 154(b) by 1007 days.

(21) Appl. No.: 12/742,818

(22) PCT Filed: Nov. 6, 2008

(86) PCT No.: PCT/EP2008/065067
§ 371 (c)(1),
(2), (4) Date: Jul. 2, 2010

(87) PCT Pub. No.: WO2009/062882
PCT Pub. Date: May 22, 2009

(65) Prior Publication Data
US 2010/0263725 A1 Oct. 21, 2010

(30) Foreign Application Priority Data
Nov. 14, 2007 (DE) .......................... 10 2007 054 384

(51) Int. Cl.
*H01L 31/18* (2006.01)
*H01L 31/0256* (2006.01)
(Continued)

(52) U.S. Cl.
CPC ...... *H01L 31/02168* (2013.01); *C23C 16/403* (2013.01); *C23C 16/45542* (2013.01); *Y02E 10/50* (2013.01)

(58) Field of Classification Search
CPC ..... H01L 31/00; H01L 27/00; H01L 31/0256; H01L 31/18; H01L 31/02168
(Continued)

(56) References Cited

U.S. PATENT DOCUMENTS 6,607,985 B1 * 8/2003 Kraft et al. .................. 438/706
7,375,378 B2 5/2008 Manivannan et al.
(Continued)

FOREIGN PATENT DOCUMENTS

CN 101548392 A 9/2009
DE 10 2007 054 384 A1 5/2009
(Continued)

OTHER PUBLICATIONS

Schmidt et al., "Surface Passivation of High-efficiency Silicon Solar Cells by Atomic-layer-deposited Al2O3", Progress in Photovoltaics: Research and Applications, vol. 16, (Mar. 2008), pp. 461-466.*
(Continued)

*Primary Examiner* — Tae-Sik Kang
(74) *Attorney, Agent, or Firm* — Birch, Stewart, Kolasch & Birch, LLP

(57) ABSTRACT

A solar cell with a dielectric double layer and also a method for the manufacture thereof are described. A first dielectric layer (3), which contains aluminum oxide or consists of aluminum oxide, and a second, hydrogen-containing dielectric layer (5) are produced by means of atomic layer deposition, allowing very good passivation of the surface of solar cells to be achieved.

16 Claims, 1 Drawing Sheet

(51) Int. Cl.
*H01L 31/0216* (2014.01)
*C23C 16/40* (2006.01)
*C23C 16/455* (2006.01)

(58) Field of Classification Search
USPC ........................................................ 136/261
See application file for complete search history.

(56) References Cited

U.S. PATENT DOCUMENTS

| | | | |
|---|---|---|---|
| 7,659,475 | B2 | 2/2010 | Agostinelli et al. |
| 2004/0107897 | A1* | 6/2004 | Lee et al. .................... 117/200 |
| 2004/0197476 | A1 | 10/2004 | Skarp et al. |
| 2005/0012975 | A1 | 1/2005 | George et al. |
| 2005/0022863 | A1 | 2/2005 | Agostinelli et al. |
| 2006/0157733 | A1 | 7/2006 | Lucovsky et al. |
| 2006/0255340 | A1 | 11/2006 | Manivannan et al. |
| 2008/0076203 | A1* | 3/2008 | Ribeyron et al. ............. 438/72 |
| 2010/0032012 | A1 | 2/2010 | Isaka et al. |
| 2010/0263725 | A1 | 10/2010 | Schmidt |

FOREIGN PATENT DOCUMENTS

| | | |
|---|---|---|
| EP | 1489667 A2 | 12/2004 |
| EP | 1 763 086 A1 | 3/2007 |
| EP | 2220689 B1 | 8/2014 |
| WO | WO 2006/096247 A2 | 9/2006 |
| WO | WO 2006/097303 A1 | 9/2006 |
| WO | WO 2007043881 A1 * | 4/2007 |
| WO | WO 2008/065918 A1 | 6/2008 |

OTHER PUBLICATIONS

FlexAL, "Atomic Layer Deposition", [online], [retrieved on Jun. 5, 2013]. Retrieved from the Internet<URL: http://www.avaco.com.br/pdf/ald_brochure.pdf>, pp. 1-5.*
Fujisaki et al., "Al2O3/Si3N4 stacked insulators for 0.1 µm gate metal-oxide-semiconductor transistors realized by high-density Si3N4 buffer layers", Applied Physics Letters, vol. 82, No. 22, (Jun. 2003), pp. 3931-3933.*
Schmidt, et al., "Surface passivation of silicon solar cells using plasma-enhanced chemical-vapour-deposited SiN films and thin thermal SiO2/plasma SiN stacks", Semiconductor Science and Technology, vol. 16, (2001), pp. 164-170.*
Hemmen, et al., "Plasma and Thermal ALD of Al2O3 in a Commercial 200 mm ALD Reactor", Journal of The Electrochemical Society, vol. 154, No. 7, (2007), pp. G165-G169.*
Gutierrez et al., "Molecular dynamics study of structural properties of amorphous Al2O3", Physical Review B, vol. 65, (2002), pp. 104202-1-104202-9.*
Havercamp et al., "A Process Design for The Production of IBC Solar Cells on Multi-Crystalline Silicon", IEEE 4th World Conference on Photovoltaic Energy Conversion, pp. 1365-1367, May 2006.
Lee et al., "Investigation of various surface passivation schemes for silicon solar cells", Solar Energy Materials & Solar Cells, vol. 90, pp. 82-92, 2006 (Available online Jun. 4, 2005).
Tucci et al., "Characterization of SiNx/a-Si:H Crystalline Silicon Surface Passivation Under UV Light Exposure", 21st European Photovotaic Solar Energy Conference, Dresden, Germany, Sep. 4-8, 2006, pp. 1404-1407.
Ulyashin et al., "Hydrogen Release and Defect Formation During Heat Treatments of SiNx:H/a-Si:H Double Passivation Layer on C-SI Substrate", IEEE 4th World Conference on Photovoltaic Energy Conversion, pp. 1354-1357, May 2006.
B. Hoex et al. "Excellent passivation of highly doped p-type Si surfaces by the negative-charge-dielectric Al2O3", Appl. Phys. Lett., vol. 91, 112107-1-112107-3, 2007.
B. Hoex et al. "Ultralow surface recombination of c-Si substrates passivated by plasma-assisted atomic layer deposited Al2O3", Appl. Phys. Lett., vol. 89, pp. 042122-1-042112-3 , 2006.

C. Jeong et al., "Plasma-assisted atomic layer growth of high-quality aluminum oxide thin films", Jpn. J. Appl. Phys., vol. 40, pp. 285-289, 2001.
G. Agostinelli et al., "Surface passivation of silicon by means of negative charge dielectrics", Proceeding of the 19th Eurpoean Photovoltaic Solar Energy Conference, pp. 132-134, Paris, France, 2004.
G. Agostinelli et al., "Very low surface recombination velocities on p-type silicon wafers passivated with a dielectric with fixed negative charge", Solar Energy Materials and Solar Cells, vol. 90, pp. 3438-3443, 2006.
I. Martin et al., "Surface passivation of p-type crystalline Si by plasma enhanced chemical vapor deposited amorphous SiCx:H films", Appl. Phys. Lett., vol. 79, pp. 2199-2201, 2001.
M. Ritala et al., "Atomic layer deposition of oxide thin films with metal alkoxides as oxygen sources", Science, vol. 288, pp. 319-321, 2000.
P. Altermatt et al., "The surface recombination velocity at boron-doped emitters: comparison between various passivation techniques", Proceeding of the 21st European Photovoltaic Solar Energy Conference, Dresden, Germany, pp. 647-650, 2006.
S. Dauwe et al., "Experimental evidence of parasitic shunting in silicon nitride rear surface passivated solar cells", Progress in Photovoltaics, vol. 10, pp. 271-278, 2002.
S. Dauwe et al., "Very low surface recombination velocities on p- and n-type silicon wafers passivated with hydrogenated amorphous silicon films", Proc. 29th IEEE Photocoltaic Specialists Conf., pp. 1246-1249, New Orleans, USA, 2002.
T. Lauinger et al., "Record low surface recombination velocities on 1 Dcm p-silicon using remote plasma silicon nitride passivation", Appl. Phys. Lett., vol. 68, pp. 1232-1234, 1996.
Antti Niskanen, "Radical Enhanced Atomic Layer Deposition of Metals and Oxides", Helsinki: University of Helsinki, Academic Dissertation, 2006; ISBN: 952-92-0982-7, pp. 1-72.
Beate Lenkeit, "Elektronische und strukturelle Eigenschaften von Plasma-Siliziumnitrid zur Oberflachenpassivierung von siebgedruckten, bifazialen Silizium-Solarzellen", Doktorarbeit aus dem Fachbereich Physik der Universitat Hannover, aus dem Jahr 2002.
Blech, et al., "Detailed Study of PECVD Silicon Nitride and Correlation of Various Characterization Techniques".
Born, et al., "Principles of Optics", Pergamon Press, 1970, Fourth Edition, pp. 51-70.
Catoir, et al., "Analysis of Hydrogen Passivation by Sputtered Silicon Nitride", 23rd European Photoboltaic Solar Energy Conference, Sep. 1-5, 2008, Valencia, Spain, pp. 1530-1533.
Gardeniers, et al."LPCVD silicon-rich silicon nitride films for applications in micromechanics, studied with statistical experimental design", J.Cac. Sci. Technol. A 14(5), Sep./Oct. 1996, pp. 2879-2892.
Goldstein, et al. "Al2O3 Atomic Layer Deposition with Trimethylaluminum and Ozone Studied by in Situ Transmission FTIR Spectroscopy and Quadrupole Mass Spectrometry", J. Phys. Chem. C 2008, 112, 19530-19539.
Groner, et al., "Interlayer Dielectrics for Semiconductor Technologies", Elsevier Inc., 2003, Chapter 10, pp. 327-348, ISBN: 978-0-12-511221-5.
Holt, et al., "Hot-wire chemical vapor deposition of high hydrogen content silicon nitride for solar cell passivation and anti-reflection coating applications", Thin Solid Films 430, 2003, pp. 37-40.
Jeong, et al. "Growth and characterization of aluminum oxide films by plasma-assisted atomic layer deposition", Materials Science and Engineering C, vol., 16, pp. 59-64, 2001.
Lauinger, et al., "Surface Passivation Properties of Silicon/Silicon Oxide/Silocon Nitride Structures for Solar Cells", 13th European Photovoltaic Solar Energy Conference, Oct. 23-27, 1995, Nice, France, pp. 1291-1294.
Martin A. Green, "Solor Cells Operating Principles, Technology, and System Applications", Prentice Hall Inc., 1982, pp. 160-165; ISBN: 0-13-822270-3.
Steven M. George, "Atomic Layer Deposition: An Overview", Chem. Rev. 2010, 110, pp. 111-131; Published on Web Nov. 30, 2009.

(56) References Cited

OTHER PUBLICATIONS

Wolf, et al., "Silicon Processing for the VLSI Era.", vol. 1: Process Technology Lattice Press, 2000, Second Edition, pp. 189-206; ISBN: 0-9616721-6-1.

Zielke, et al., "Contact passivation in silicon solar cells using atomic-layer deposited aluminum oxide layers", Phys. Status Solidi RRL 5, No. 8, pp. 298-300, (2011).

* cited by examiner

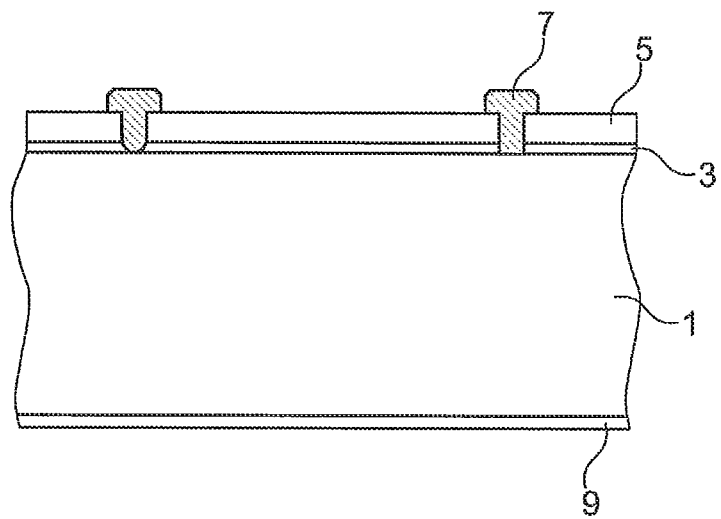

METHOD FOR MANUFACTURING A SOLAR CELL WITH A SURFACE-PASSIVATING DIELECTRIC DOUBLE LAYER, AND CORRESPONDING SOLAR CELL

FIELD OF THE INVENTION

The present invention relates to a method for manufacturing a solar cell with a surface-passivating dielectric double layer and to a corresponding solar cell.

BACKGROUND OF THE INVENTION

A key requirement for achieving high degrees of efficiency in solar cells is very effective suppression of surface recombination losses. For this purpose, the surface of solar cells should be passivated as effectively as possible, so that charge carrier pairs which are generated inside the solar cell by incident light and which diffuse to the surfaces of the solar cell substrate do not recombine at the solar cell surface, so that they would no longer be available to help improve the efficiency of the solar cell.

In laboratory solar cells, this problem is often solved by growing silicon dioxide at a high temperature (for example >900° C.). However, as a high-temperature process step of this type means considerable additional expenditure in solar cell processing, surface passivation of this type is at present generally not used in the industrial manufacture of solar cells.

A further difficulty of high-temperature oxidation is the sensitivity of more economical multicrystalline silicon in relation to high temperatures which can lead in this material to a considerable reduction in material quality, i.e. the charge carrier lifetime, and thus to losses in efficiency.

A low-temperature alternative is surface passivation using amorphous silicon nitride or silicon carbide which can be prepared at temperatures of 300-400° C. by means of plasma enhanced chemical vapour deposition (PECVD), for example. Surface passivation of this type is for example described in T. Lauinger et al.: "Record low surface recombination velocities on 1 □cm p-silicon using remote plasma silicon nitride passivation", Appl. Phys. Lett. 68, 1232-1234 (1996); and in I. Martin et al.: "Surface passivation of p-type crystalline silicon by plasma enhanced chemical vapor deposited amorphous $SiC_x$ films", Appl. Phys. Lett. 79, 2199-2201 (2001). However, the dielectric layers produced in this way can be used only to a limited degree for large-area, high-efficiency solar cells, as they can contain a high density of what are known as "pinholes", i.e. small holes or pores in the layer, so that they may not have good insulating properties. In addition, their passivating effect is based largely on a very high positive charge density within the dielectric layers that can lead, during the passivation of the back of the solar cell if p-type silicon wafers are used, for example, to the formation of an inversion layer via which an additional leakage current of minority charge carriers can flow away from the base of the solar cell to the back contacts (what is known as a "parasitic shunt"). On highly boron-doped $p^+$ silicon surfaces, silicon nitride can even lead, on account of the high positive charge density, to depassivation compared to an unpassivated $p^+$ surface.

Very good passivations, both on p and on $p^+$ surfaces, were achieved using amorphous silicon layers which can also be produced by means of plasma enhanced vapour deposition at very low coating temperatures (typically <250° C.), such as is described for example in S. Dauwe et al.: "Very low surface recombination velocities on p- and n-type silicon wafers passivated with hydrogenated amorphous silicon films", Proc. 29th IEEE Photovoltaic Specialists Conf., New Orleans, USA (2002), p. 1246; and in P. Altermatt et al.: "The surface recombination velocity at boron-doped emitters: comparison between various passivation techniques", Proceeding of the 21st European Photovoltaic Solar Energy Conference, Dresden (2006), p. 647.

However, the surface-passivating property of amorphous silicon layers of this type may be very susceptible to temperature treatments. In current-day industrial solar cell processes, the metal coating is in many cases carried out by means of screen printing technology, the last process step typically being a firing of the contacts in a continuous infrared furnace at temperatures between approx. 800° C. and 900° C. Although the solar cell is exposed to these high temperatures only for a few seconds, this firing step can lead to considerable degradation of the passivating effect of the amorphous silicon layers.

Good passivating results can also be achieved using aluminium oxide layers which are deposited by means of atomic layer deposition (ALD) at about 200° C., for example, and subsequently tempered at about 425° C. Nevertheless, in atomic layer deposition, only a single molecular layer of the material to be deposited is generally deposited on the substrate surface within each deposition cycle. As a deposition cycle typically lasts about 0.5 to 4 s, correspondingly low deposition rates are obtained. The deposition of aluminium oxide layers at a thickness which is suitable for use as an antireflection layer or as a back reflector therefore requires deposition durations which have in the past shown a use of such layers in industrially produced solar cells to be commercially disadvantageous.

SUMMARY OF THE INVENTION

There may be a need for a solar cell and for a method for manufacturing a solar cell in which, on the one hand, good passivation of the surface of the solar cell can be achieved and, on the other hand, the above-mentioned drawbacks of conventional surface-passivating layers can be at least partially avoided. In particular, it should be possible to produce solar cells displaying very good surface passivation in an economical, industrially viable manner.

This need can be met by the subject matter of the independent claims. Advantageous embodiments of the present invention are described in the dependent claims.

According to a first aspect of the present invention, a method is proposed for manufacturing a silicon solar cell, including the following steps: providing a silicon substrate; depositing a first dielectric layer on a surface of the silicon substrate by means of atomic layer deposition, wherein the first dielectric layer comprises aluminium oxide; and depositing a second dielectric layer on a surface of the first dielectric layer, the materials of the first and the second dielectric layer differing and hydrogen being embedded into the second dielectric layer.

This first aspect of the present invention may be regarded as being based on the following idea: a method is specified for manufacturing silicon solar cells with a dielectric passivating layer for reducing surface recombination losses. The dielectric passivating layer is composed of two partial layers, of a very thin aluminium oxide-containing layer, which is formed by atomic layer deposition (ALD), and also of a thicker layer made of silicon oxide, silicon nitride or silicon carbide, for example, which can be deposited on the aluminium oxide layer by means of plasma enhanced chemical vapour deposition (PECVD), for example.

The dielectric double layer produced in the method according to the first aspect allows the passivation of both high and low-doped regions of the solar cell surface of conduction type p or n. It is possible to allow stable passivation which retains its passivating properties even after a firing step in the temperature range of 800-900° C. for burning-in of metal contacts. At the same time, the dielectric passivating layer can also have advantageous optical properties, i.e. for application to the front of the solar cell, the layer can serve as an effective antireflection layer; during application to the back of the solar cell, the passivating layer can form, together with metal coating over the entire area of the back, an effective mirror for photons with energies close to the silicon band gap in order to improve what is known as "light trapping", i.e. the trapping of light by multiple internal reflection, in the solar cell. Furthermore, the negative effect of "parasitic shunting", which is known from silicon nitride, can be avoided for rear surface passivation on standard solar cell semiconductor material of conduction type p.

The key to understanding the outstanding passivating effect and tempering stability of the stack layer according to the invention may be identified in the combination of the Si/$Al_2O_3$ interface, which is ideally atomically flat and is produced as a matter of course during the ALD process, and the highly hydrogenous $SiO_x$, $SiN_x$ or $SiC_x$ layers, such as are formed during the PECVD process, for example. A part of the hydrogen from the PECVD-deposited layers can diffuse through the ultrathin $Al_2O_3$ layer and passivate unsaturated silicon bonds at the interface to the silicon.

Features, details and possible advantages of embodiments of the manufacturing method according to the invention will be described hereinafter.

The silicon substrate provided may be a thin monocrystalline or multicrystalline silicon wafer or else a silicon thin layer.

The surface to be coated may be the front of the solar cell substrate that faces the incident light during use. In this case, the second dielectric layer is applied preferably as an antireflection layer, i.e. at a thickness at which negative interferences occur for the incident and reflected light. The thickness may be selected in the range from about 50 to 150 nm, depending on the index of refraction of the material used for the second dielectric layer.

Alternatively, the surface to be coated may be the back of the solar cell substrate that is remote from the incident light during use. In this case, the second dielectric layer is embodied preferably as what is known as a back surface reflector, so that light, in particular infrared light, which penetrates the entire solar cell, is for the most part reflected at this back surface and thus passes through the solar cell substrate a further time.

Before the depositing of the first dielectric layer, the surface of the silicon substrate can be thoroughly cleaned, so that no contamination remains thereon that might disturb the subsequently deposited dielectric layer. In particular, the surface of the silicon substrate can be slightly etched away, for example in a solution which on the one hand contains an oxidizing agent and which on the other hand contains hydrofluoric acid (HF) which etches away the oxidized silicon oxide. A suitable cleaning method known in the production of solar cells is for example what is known as RCA cleaning.

According to one embodiment of the method according to the invention, for the atomic layer deposition of the first dielectric layer, the silicon substrate is firstly flushed with an aluminium-containing compound comprising at least one of the components $Al(CH_3)_3$, $AlCl_3$, $Al(CH_3)_2Cl$ and $(CH_3)_2(C_2H_5)N{:}AlH_3$, so that an aluminium-containing layer is deposited on the surface of the silicon substrate. Subsequently, the aluminium-containing layer is oxidized to higher valency in an oxygen-containing atmosphere.

During the flushing of the silicon substrate with the aluminium-containing compound, the aluminium-containing compound can cling to the silicon surface at the points at which it enters into contact with the silicon surface. A chemical reaction with the silicon surface can occur; this is also referred to as chemisorption. In the best of cases, this can lead to the formation of a monomolecular layer made up of molecules of the aluminium-containing compound. It may be advantageous in this regard that this molecular layer can be almost perfectly tight, i.e. on correct selection of the processing parameters, such as duration and temperature during flushing, the entire silicon surface is covered with molecules of the aluminium-containing compound. This allows the subsequently produced first dielectric layer to be substantially atomically or molecularly tight.

In a subsequent processing step, the previously deposited molecular layer of the aluminium-containing compound is oxidized to higher valency. This can take place for example by flushing with oxygen or an oxygen-containing gas. In order to speed up the chemical reactions, the oxygen can be provided in the form of a high-energy $O_2$ plasma (plasma enhanced deposition), wherein it may be advantageous to ignite the $O_2$ plasma not directly above the substrates but in a separate chamber and then to guide it to the substrates (what is known as "remote plasma ALD"). Alternatively, the oxygen can be introduced at high temperatures (thermally enhanced deposition). A layer is then formed that at least contains $Al_2O_3$ molecules and that preferably consists entirely of $Al_2O_3$ molecules. It is in this way possible for a substantially monomolecular layer made up of $Al_2O_3$ molecules to be deposited at a thickness of about 1.2 angstroms (0.12 nm).

The process described hereinbefore can be repeated several times in order to achieve a sufficient thickness of the aluminium oxide layer. This draws on the fact that the molecules of the aluminium-containing compound cannot stick to one another, but can stick to the aluminium oxide molecules which are subsequently oxidized to higher valency. The first dielectric layer can thus be constructed layer by layer, allowing very good homogeneity and thus quality of the layer to be effected.

The entire sequential deposition process can be carried out in a common chamber into which the aluminium-containing compound is firstly introduced, that is subsequently flushed, and into which subsequently the oxygen-containing atmosphere is introduced before the process can then start up again.

An essential advantage of the atomic layer deposition is the fact that the entire substrate surface is coated uniformly. The deposition takes place irrespective of the geometry of the substrate surface, i.e. it is conform to the surface. The first dielectric layer is therefore deposited at the same thickness all over. This is beneficial in particular in surface-textured solar cells or in solar cells with channels which are intended to electrically contact the front with the back of the solar cell (what are known as EWT (emitter wrap through) solar cells), as passivation of the entire relevant solar cell surface can be ensured.

According to one embodiment of the method according to the invention, the second dielectric layer comprises silicon nitride, silicon oxide and/or silicon carbide. These materials display very good optical properties such as for example high transparency in almost the entire solar spectrum. They are therefore particularly suitable as the antireflection layer. Furthermore, dielectric layers made of these materials can contain a high hydrogen content; this can help to further passivate the solar cell.

According to one embodiment of the method according to the invention, the second dielectric layer is produced by means of a PECVD method. This method, in which reactants such as for example silane ($SiH_4$), dinitrogen oxide ($N_2O$), carbon dioxide ($CO_2$), ammonia ($NH_4$) and/or methane ($CH_4$) are reacted by igniting a plasma, can produce high-quality dielectric layers which are made of silicon nitride, silicon oxide or silicon carbide and can in addition have a high hydrogen content.

According to one embodiment of the method according to the invention, the second dielectric layer is deposited in such a way that it has a hydrogen content of at least 1 at. %, preferably at least 2 at. % and more preferably at least 5 at. %. The embedded hydrogen can diffuse at least in part through the first dielectric layer positioned therebelow and contribute to passivation there by saturating free bonds of the silicon ("dangling bonds"). It has been found that this contribution can even be still higher than in the case in which a hydrogen-containing dielectric is deposited directly on a silicon surface.

According to one embodiment of the method according to the invention, a high-temperature step is carried out at temperatures above 600° C., preferably above 700° C. and more preferably above 800° C., after the depositing of the second dielectric layer. A high-temperature step of this type can for example be used to fire, during further processing of the solar cell, metal contacts, which were printed beforehand onto the solar cell surface by means of screen printing, into the solar cell. The high-temperature step can in this case have the further advantage that hydrogen contained in the second dielectric layer can easily diffuse at the elevated temperatures through the first dielectric layer and saturate bonds of the silicon that are still free; this can lead to a further improvement in the passivating effect.

According to one embodiment of the method according to the invention, the first dielectric layer is deposited at a thickness of less than 50 nm, preferably less than 30 nm and more preferably less than 10 nm. Even at very low thicknesses, the first dielectric layer offers very good surface-passivating properties on account of its high quality which can be achieved as a result of the atomic layer deposition. The thinner the layer is, the more rapidly it can be deposited, although a minimum thickness of about 0.5 nm, preferably about 2 nm, should not be undershot in order to ensure tightness of the layer.

According to one embodiment of the method according to the invention, the second dielectric layer is deposited at a thickness of more than 50 nm, preferably more than 100 nm and more preferably more than 200 nm. As described hereinbefore, the thickness of the second dielectric layer can be adapted to its task as the antireflection layer or back surface reflector.

According to a second aspect of the present invention, a solar cell is proposed comprising a silicon substrate; a first dielectric layer comprising aluminium oxide on a surface of the silicon substrate; and a second dielectric layer on a surface of the first dielectric layer, the materials of the first and the second dielectric layer differing and hydrogen being embedded into the second dielectric layer.

It should be noted that the embodiments, features and advantages of the invention have been described mainly in relation to the manufacturing method according to the invention. However, a person skilled in the art will recognise both from the foregoing and from the subsequent description that, unless otherwise indicated, the embodiments and features of the invention are also transferable by analogy to the solar cell according to the invention. In particular, the features of the various embodiments may also be combined with one another in any desired manner.

In summary, the method or the solar cell according to aspects and embodiments of the present invention is distinguished from previously known methods for the surface passivation of crystalline silicon solar cells or solar cells coated in this way inter alia in terms of the following points:
(i) very good surface passivation, such as is necessary for achieving high degrees of solar cell efficiency, can be achieved even after a firing step in the temperature range of 800-900° C.;
(ii) both low and high doped n- and p-type silicon surfaces can be passivated very effectively;
(iii) on account of the high negative charge density in the $Al_2O_3$ layer on p-type silicon, no inversion layer is induced below the passivating layer in the silicon, allowing the harmful effect of a "parasitic shunt" to be substantially avoided;
(iv) the layers contain no pinholes;
(v) it is possible to achieve in a simple manner very good optical properties of the layer system that can be adapted very easily to the requirements of the solar cell by way of the thickness and the composition of the, for example PECVD-deposited, layer, so that the layer system can for example be embodied as an antireflection layer on the front of the solar cell or as an infrared reflector on the back of the solar cell in combination with a metal coating over the entire surface of the passivating layer.

BRIEF DESCRIPTION OF THE DRAWINGS

Further features and advantages of the present invention will become apparent to the person skilled in the art from the subsequent description of an exemplary embodiment, although this is not to be interpreted as restricting the invention, and with reference to the accompanying drawing, in which:

FIG. 1 illustrates schematically a solar cell according to one embodiment of the present invention.

DETAILED DESCRIPTION OF EMBODIMENTS

An exemplary embodiment of the manufacturing method according to the invention will be specified hereinafter.

A silicon wafer 1, which has not yet been fully processed to form the solar cell and into which an emitter on a surface was, for example, diffused beforehand and the surface of which was cleaned thoroughly, is introduced into an evacuated coating chamber and an Al-containing compound, such as for example $Al(CH_3)_3$, is fed into the chamber as a reactant. Chemisorption causes the molecules of the reactant to be deposited on the silicon surface until the surface is saturated. The non-chemisorbed molecules of the reactant are subsequently removed from the chamber, for example in that the chamber is flushed with a flushing gas such as for example nitrogen.

Subsequently, an $O_2$ plasma is ignited above the silicon surface to be passivated or in a separate chamber and the oxygen radicals react with the chemisorbed molecules to form $Al_2O_3$. In the best of cases, a monomolecular aluminium oxide layer is formed. The temperature of the silicon wafer is in this case kept as constantly as possible at a temperature which is in the range between room temperature and 450° C.

After a cycle of this type, the coating chamber is evacuated again and a new cycle commences. This process is repeated until the desired thickness of the $Al_2O_3$ layer is reached. In order to keep the total coating duration as short as possible, the layer thickness of the $Al_2O_3$ layer 3 is limited to about 5 nm, i.e. the ALD coating process is repeated about 40 to 50 times, resulting in a total coating duration of from about 20 to 200 s.

The variant of ALD described herein is referred to as "plasma-assisted ALD" and is well known from the literature; see for example C. W. Jeong et al., Plasma-assisted atomic layer growth of high-quality aluminum oxide thin films, Jpn. J. Appl. Phys. 40, 285-289 (2001). Tests have shown that particularly good surface passivation can be achieved in that the plasma does not have direct contact to the substrates, as, in the event of such contact, ion bombardment can damage the substrate surfaces, but rather burns in a separate chamber from which the radicals are subsequently guided to the substrate surface. This variant of the method is referred to as "remote plasma-assisted ALD" and is described in U.S. Pat. No. 7,410,671, for example.

Alternatively, the $Al_2O_3$ thin layer 3 can also be deposited by means of thermal ALD, as described in the literature in M. Ritala et al., Atomic layer deposition of oxide thin films with metal alkoxides as oxygen sources, Science 288, 319-321 (2000), for example.

The $Al_2O_3$ thin layer 3 deposited on the silicon wafer is subsequently coated in a PECVD reactor with a silicon oxide thin layer 5 in a continuous process at a high deposition rate. The deposition temperature is in this case in the range between room temperature and 450° C. The gases used are $SiH_4$ and $N_2O$.

$N_2O$ can in this case also be replaced by $CO_2$. It is also possible to deposit a silicon nitride layer by exchanging the $N_2O$ for $NH_4$ or to deposit a silicon carbide layer by exchanging the $N_2O$ for $CH_4$. If the deposition takes place at temperatures below 400° C., subsequent tempering for approx. 30 min in the temperature range of 400-500° C. can have a positive effect in order to achieve the optimum passivating quality of the layer system.

Finally, metal contacts 7, 9 are applied, for example by means of screen printing, to the front and the back of the coated silicon substrate and fired-in in a continuous furnace at about 700-900° C.

In summary and in other words, aspects of the present invention may be described as follows:

A method is proposed for forming a stack layer, the stack layer consisting of two partial layers:
(i) a very thin (for example 10 nm) aluminium oxide thin layer formed by atomic layer deposition (ALD) from an aluminium-containing gas (for example trimethylaluminium $Al(CH_3)_3$), and also
(ii) a thicker (>30 nm) silicon oxide-containing thin layer which can be formed, for example by means of plasma enhanced chemical vapour deposition (PECVD), from the gases silane ($SiH_4$) and dinitrogen oxide ($N_2O$) or carbon dioxide ($CO_2$).

The second layer may also be, instead of a silicon oxide thin layer, a silicon nitride-containing thin layer formed from the gases silane ($SiH_4$) and ammonia ($NH_4$) by means of PECVD, or a silicon carbide-containing thin layer formed from the gases silane ($SiH_4$) and methane ($CH_4$). The thin layers made of silicon oxide, silicon nitride or silicon carbide, which are deposited by means of PECVD, have a very high hydrogen content (for example >5 at. %) and therefore serve as a source of hydrogen during a firing step in the temperature range of 700-900° C. The hydrogen diffuses through the ultrathin $Al_2O_3$ layer and passivates unsaturated silicon bonds ("dangling bonds") at the $Si/Al_2O_3$ interface, leading to very good surface passivation after the firing step. In this way, the combination according to the invention of the two known deposition methods, ALD and PECVD, allows the formation of a firing-stable passivating layer which is optimally suitable for solar cells.

The invention claimed is:

1. Method for manufacturing a silicon solar cell, including the following steps:
   providing a silicon substrate;
   depositing a first dielectric layer having a thickness of less than 50 nm on a surface of the silicon substrate by means of atomic layer deposition, wherein the first dielectric layer comprises aluminium oxide; and
   depositing a second dielectric layer directly on a surface of the first dielectric layer, materials of the first dielectric layer and the second dielectric layer differing and hydrogen being embedded into the second dielectric layer.

2. The method according to claim 1, wherein, for the depositing the first dielectric layer, the silicon substrate is firstly flushed with an aluminium-containing compound comprising at least one of $Al(CH_3)_3$, $AlCl_3$, $Al(CH_3)_2Cl$ and $(CH_3)_2(C_2H_5)N:AlH_3$, so that an aluminium-containing layer is deposited on the surface of the silicon substrate, and wherein the aluminium-containing layer is subsequently oxidized to higher valency in an oxygen-containing atmosphere.

3. The method according to claim 1, wherein the second dielectric layer comprises a material selected from the group consisting of silicon nitride, silicon oxide and silicon carbide.

4. The method according to claim 1, wherein the second dielectric layer is manufactured by means of a PECVD method.

5. The method according to claim 1, wherein the second dielectric layer is deposited in such a way that the second dielectric layer has a hydrogen content of at least 1 at. %.

6. The method according to claim 1, wherein a high-temperature step is carried out at temperatures above 600° C. after the depositing of the second dielectric layer.

7. The method according to claim 1, wherein no further dielectric layers are deposited on the surface of the silicon substrate on which the first dielectric layer and the second dielectric layer are deposited.

8. The method according to claim 1, wherein the first dielectric layer is deposited with a thickness of less than 30 nm.

9. The method according to claim 1, wherein, for the depositing the first dielectric layer, the silicon substrate is firstly flushed with an aluminium-containing compound comprising at least one of $Al(CH_3)_3$, $AlCl_3$, $Al(CH_3)_2Cl$ and $(CH_3)_2(C_2H_5)N:AlH_3$, so that an aluminium-containing layer is deposited on the surface of the silicon substrate, and wherein the aluminium-containing layer is subsequently oxidized to higher valency in an oxygen-containing atmosphere; and
   wherein a high-temperature step is carried out at temperatures above 600° C. after the depositing of the second dielectric layer.

10. The method according to claim 1, wherein the second dielectric layer comprises a material selected from the group consisting of silicon nitride, silicon oxide and silicon carbide;
   wherein the second dielectric layer is manufactured by means of a PECVD method;
   wherein the second dielectric layer is deposited in such a way that the second dielectric layer has a hydrogen content of at least 1 at. %; and
   wherein the second dielectric layer is deposited at a thickness of more than 50 nm.

11. The method according to claim 1, wherein, for the depositing the first dielectric layer, the silicon substrate is firstly flushed with an aluminium-containing compound comprising at least one of $Al(CH_3)_3$, $AlCl_3$, $Al(CH_3)_2Cl$ and $(CH_3)_2(C_2H_5)N{:}AlH_3$, so that an aluminium-containing layer is deposited on the surface of the silicon substrate, and wherein the aluminium-containing layer is subsequently oxidized to higher valency in an oxygen-containing atmosphere;
   wherein the second dielectric layer comprises a material selected from the group comprising of silicon nitride, silicon oxide and silicon carbide;
   wherein the second dielectric layer is manufactured by means of a PECVD method;
   wherein the second dielectric layer is deposited in such a way that the second dielectric layer has a hydrogen content of at least 1 at. %;
   wherein a high-temperature step is carried out at temperatures above 600° C. after the depositing of the second dielectric layer; and
   wherein the second dielectric layer is deposited at a thickness of more than 50 nm.

12. A solar cell comprising:
   a silicon substrate;
   a first dielectric layer comprising aluminium oxide on a surface of the silicon substrate; and
   a second dielectric layer directly on a surface of the first dielectric layer, materials of the first dielectric layer and the second dielectric layer differing and hydrogen being embedded into the second dielectric layer;
   wherein the first dielectric layer has a thickness of less than 50 nm and is interposed between the surface of the silicon substrate and the second dielectric layer.

13. The solar cell according to claim 12, wherein the second dielectric layer comprises a material selected from the group consisting of silicon nitride, silicon oxide and silicon carbide.

14. The solar cell according to claim 12, wherein the first dielectric layer has a thickness of less than 30 nm.

15. The solar cell according to claim 12, wherein the first dielectric layer is deposited by means of atomic layer deposition, so that the first dielectric layer is substantially atomically tight;
   wherein the second dielectric layer comprises a material selected from the group consisting of silicon nitride, silicon oxide and silicon carbide;
   wherein the second dielectric layer has a thickness of more than 50 nm; and
   wherein the first dielectric layer has a thickness of less than 50 nm.

16. A solar cell comprising:
   a silicon substrate; and
   a dielectric double layer consisting of
      a first dielectric layer comprising aluminum oxide on a surface of the silicon substrate, and
      a second dielectric layer directly on a surface of the first dielectric layer, materials of the first dielectric layer and second dielectric layer differing and hydrogen being embedded in the second dielectric layer.

* * * * *

(12) INTER PARTES REVIEW CERTIFICATE (2993rd)
United States Patent (10) Number: US 9,893,215 K1
Schmidt et al. (45) Certificate Issued: Jan. 30, 2023

(54) METHOD FOR MANUFACTURING A SOLAR CELL WITH A SURFACE-PASSIVATING DIELECTRIC DOUBLE LAYER, AND CORRESPONDING SOLAR CELL

(75) Inventors: Jan Schmidt; Bram Hoex

(73) Assignee: HANWHA SOLUTIONS CORPORATION

Trial Numbers:

IPR2019-01072 filed May 13, 2019
IPR2019-01145 filed Jun. 3, 2019

Inter Partes Review Certificate for:

Patent No.: 9,893,215
Issued: Feb. 13, 2018
Appl. No.: 12/742,818
Filed: Jul. 2, 2010

The results of IPR2019-01072; IPR2019-01145 are reflected in this inter partes review certificate under 35 U.S.C. 318(b).

INTER PARTES REVIEW CERTIFICATE
U.S. Patent 9,893,215 K1
Trial No. IPR2019-01072
Certificate Issued Jan. 30, 2023

AS A RESULT OF THE INTER PARTES REVIEW PROCEEDING, IT HAS BEEN DETERMINED THAT:

Claims 12-14 are cancelled.

\* \* \* \* \*